United States Patent [19]

Ogura

[11] Patent Number: 4,492,973
[45] Date of Patent: Jan. 8, 1985

[54] MOS DYNAMIC MEMORY CELLS AND METHOD OF FABRICATING THE SAME

[75] Inventor: Mitsugi Ogura, Yokohama, Japan

[73] Assignee: Tokyo Shibaura Denki Kabushiki Kaisha, Kawasaki, Japan

[21] Appl. No.: 335,601

[22] Filed: Dec. 30, 1981

Related U.S. Application Data

[63] Continuation of Ser. No. 104,866, Dec. 18, 1979, abandoned.

[30] Foreign Application Priority Data

Dec. 25, 1978 [JP] Japan .............................. 53-158709
Dec. 25, 1978 [JP] Japan .............................. 53-158710

[51] Int. Cl.³ .................. H01L 29/78; H01L 27/02; H01L 29/04; G11C 11/24
[52] U.S. Cl. ................................. 357/23; 357/41; 357/54; 357/59; 365/149
[58] Field of Search .............. 357/23 C, 24, 41, 59, 357/23 CS, 23 D, 54; 365/149

[56] References Cited

U.S. PATENT DOCUMENTS

| | | | |
|---|---|---|---|
| 4,004,159 | 1/1977 | Rai et al. | 357/59 |
| 4,012,757 | 3/1977 | Koo | 357/41 |
| 4,060,738 | 11/1977 | Tasch et al. | 357/24 |
| 4,112,575 | 9/1978 | Fu et al. | 357/41 |
| 4,115,795 | 9/1978 | Masuoka et al. | 357/41 |
| 4,152,779 | 5/1979 | Tasch et al. | 357/41 |
| 4,164,751 | 8/1979 | Tasch | 357/41 |
| 4,225,945 | 9/1980 | Kuo | 357/41 |
| 4,291,322 | 9/1981 | Clemens et al. | 357/23 C |

OTHER PUBLICATIONS

Tasch et al., "The Hi-C RAM Cell Concept", IEEE Trans. Electron Devices, vol. ED-25, (1/78), pp. 33-41.

Primary Examiner—Gene M. Munson
Attorney, Agent, or Firm—Oblon, Fisher, Spivak, McClelland & Maier

[57] ABSTRACT

The MOS dynamic memory cell comprises a first electroconductive layer formed on a surface of a first region of a semiconductor substrate having a first conductivity type and an impurity concentration of less than $5 \times 10^{14}$ cm$^{-3}$ through a first insulating film, a second semiconductor region having a higher impurity concentration than the first semiconductor region and provided adjacent to one end of the first semiconductor region, a second electroconductive layer formed on the second semiconductor region through a second insulating film, and a third semiconductor region of a second conductivity type and provided adjacent to the second semiconductor region. The second electroconductive layer is used as a row line, whereas the third semiconductor region is used as a column line as well as a digit line. An inversion layer is formed on a surface of the first semiconductor region. The MOS dynamic memory cell is used to fabricate a MOS dynamic random access memory.

10 Claims, 10 Drawing Figures

MOS DYNAMIC MEMORY CELLS AND METHOD OF FABRICATING THE SAME

This is a continuation of Application Ser. No. 104,866, filed Dec. 18, 1979, now abandoned.

BACKGROUND OF THE INVENTION

This invention relates to a MOS (metal oxide semiconductor) dynamic memory cell having one MOS transistor and one MOS capacitor and a method of fabricating the same.

In order to fabricate a MOS dynamic memory device by integrating minature memory cells at a high density it is essential to reduce the thickness of the oxide film of each memory cell, the depth of a diffused layer, the voltage of a power supply applied to the memory cell, ect., according to a predetermined definite ratio that is by using so-called proportional reducing technique. For example, for fabricating an integrated circuit for use in a MOS dynamic memory device having a capacity of 16K bits the power supply voltage may be 12 V, and the bias voltage applied to a semiconductor substrate may be $-5$ V, whereas in the case of a MOS dynamic memory device having a capacity of 64K bits, it is generally necessary to use a single power supply of 5 V and to use a pattern size of 3 to $4\mu$ rule for the MOS memory cell.

Where a memory cell is constituted by one MOS transistor and one MOS capacitor, the MOS transistor and the MOS capacitor are juxtaposed so that writing information into the MOS capacitor in the form of potential and reading out the stored information can be accomplished by controlling the turning ON and OFF of the MOS transistor. In a memory cell constructed as above described, however, as the inversion voltages of the MOS transistor and MOS capacitor increase owing to so-called back bias effect (that is an effect in which the threshold voltage of the MOS transistor varies according to the voltage between the source and substrate of the MOS transistor) the potential stored into the cell, that is the potential stored into the MOS capacitor decreases to about 75% of the voltage of a power supply. Thus for example, for a voltage of the power supply of 12 V, the voltage written into the MOS capacitor decreases to about 9 V and for a voltage of the power supply of 5 V, the voltage written into the MOS capacitor decreases to about 3.75 V. The difference between the voltage of a power supply and voltage being written into the MOS capacitor is deemed as a loss.

Let us consider the inversion voltage or threshold voltage of the MOS transistor and the MOS capacitor.

Upon application of a gate voltage upon the gate electrode of the MOS transistor, an electric field is formed in a region of the semiconductor substrate of a first conductivity type confronting the gate electrode so that the minority carriers presenting in the substrate are collected in the surface of the region whereby the surface of that region would become a second conductivity type to form a channel. The MOS transistor is rendered ON when the channel is formed, whereas is rendered OFF when the channel is not formed. The minimum gate voltage at which a channel is formed is termed the inversion voltage or threshold voltage, the former $V_T$ is expressed by the following equation (1)

$$V_T = V_{FB} + 2\phi_{FP} - \frac{Q_B}{C_O} \quad (1)$$

when $V_{FB}$ represents the flat band voltage (which will be described later in detail), $Q_{FP}$ the Fermi level of the substrate, $C_O$ the capacity per unit area of the MOS transistor and $Q_B$ is expressed by the following equation (2)

$$Q_B = -\sqrt{2\epsilon_s\epsilon_o g N_A(2\phi_{FP} + V_{RS})} \quad (2)$$

where
$\epsilon_s$: the specific dielectric constant of the substrate
$\epsilon_o$: dielectric constant under vacuum
$g$: unit charge
$N_A$: impurity concentration of the substrate
$V_{RS}$: the source potential of the MOS transitor to the substrate.

Equation (1) is also applicable to a MOS capacitor, in which case $V_T$ represents the threshold voltage of the MOS capacitor, $C_O$ the capacitance of the MOS capacitor, $V_{RS}$ the voltage around the MOS capacitor to the substrate.

As can be noted from equation (1) when the gate voltage of the MOS transistor is lower than the invention or threshold voltage expressed by equation (1) the MOS transistor does not turn ON, and since the inversion voltage increases with the source voltage it is necessary to increase the gate voltage in order to maintain the MOS transistor in the conductive state. Where the gate voltage of the MOS transistor is maintained at a constant value larger than the threshold voltage an information is written into the MOS capacitor in the form of voltage via a digital line connected to the source electrode of the MOS transistor. As a consequence, the voltage of the MOS capacitor increases gradually so that the inversion voltage of the MOS transistor also increases with the voltage of the MOS capacitor. Denoting the constant gate voltage by $V_G$, and the voltage written into the MOS capacitor by $V_C$, the value $(V_G - V_C)$ decreases with increase in the voltage of the MOS capacitor.

At a time when a conditions $$V_G - V_C < V_T$$

is satisfied, as the MOS transistor turns OFF, a voltage higher than $V_C$ can not be written into the MOS capacitor as long as the gate voltage $V_G$ is constant. Increase in the inversion voltage of the MOS capacitor results in the some tendency as the increase in the inversion voltage of the MOS transistor.

A disadvantage caused by the increase in the threshold voltage of the MOS capacitor can be prevented by rendering the surface of the semiconductor substrate facing an electrode of the MOS capacitor to have a conductivity type opposite to that of the substrate as disclosed in Japanese Patent Publication No. 13252/1973. This method, however, requires provision of a diffused layer which interconnects the MOS transistor region and the MOS capacitor region. Such diffused layer prevents increase in the density of integration of the memory cells. A memory cell not requiring such diffused layer is disclosed in Japanese laid open patent specification No. 137399/1976. In this memory cell, an extension of the gate electrode of the MOS transistor region disposed adjacent to one end of the MOS capacitor region is arranged on an electrode of the MOS capacitor region through an insulating layer, such structure being termed a double polycrystalline silicon structure, and can eliminate a diffused region interconnecting the MOS transistor region and the MOS capacitor region.

In the memory cell constructed as above described, although it is desirable to construct the MOS transistor to operate in an enhancement mode and the MOS capacitor in a depletion mode, it is extremely difficult to obtain such construction. More particularly, according to a prior art method of fabricating a MOS capacitor of a depletion mode, ions of phosphor or arsenic were implanted into the surface of a substrate corresponding to the MOS capacitor region. Such ion implantation step requires use of an IC mask. Use of the IC mask inherently results in an alignment error so that it is necessary to completely shield a region other than the region to be implanted with ions with a mask. It can be understood that it is extremely difficult to form a MOS transistor region adjacent to the region implanted with ions, that is at a portion closely adjacent to the MOS capacitor region, when one considers the alignment error described above. For the purpose of preventing ion implantation into a portion of the MOS transistor region close to the MOS capacitor region, if the mask were shifted towards the MOS capacitor region, the ion implantation would not be made in a region interconnecting the MOS transistor and the MOS capacitor. For this reason, a potential barrier would be formed in the interconnecting region, thus failing to manifest an effect obtainable by forming the MOS capacitor to operate in a depletion mode. This is the reason why it has been difficult to form the MOS capacitor to have a depletion mode in the prior art memory cell in which the MOS capacitor and the MOS transistor were disposed closely. For this reason, due to the above described back bias effect, a voltage of only about 75% of the power supply voltage could be written into the MOS capacitor.

In such a case, the following disadvantage occurs. The level of a single $V_S$ read out from the memory cell can approximately be given by the following equation $$V_S = (C_C/C_P)V_C$$

where $C_C$ represents the capacitance of the MOS capacitor, $C_P$ a stray capacitance presenting on one digit line of a dynamic RAM constituted by the memory cells described above, and $V_C$ a potential written into the MOS capacitor. When $V_C$ is small, $V_S$ is also small. As the $V_S$ becomes small the signal read out will be affected by noises. Further, the sensing range of a sense amplifier utilized to read out the signal from the memory cell would be narrowed. Moreover as the amount of charge stored in the memory cell is small it is necessary to make short the refresh interval. In order not to make small the amount of charge it is necessary to increase the size of the chip, thus increasing the cost of manufacturing.

Various problems to be solved in a memory cell wherein a MOS transistor region and a MOS capacitor region are disposed closely adjacent have been discussed above. These problems involves the necessity of increasing the voltage to be written into the MOS capacitor up to substantially the power supply voltage, not to diminish the inversion layer of the MOS capacitor region even when a voltage information is written into the MOS capacitor, and the necessity of eliminating a diffused layer interconnecting the MOS transistor region and the MOS capacitor region, thus reducing the size of the chip.

SUMMARY OF THE INVENTION

Accordingly it is an object of this invention to provide a MOS dynamic memory cell capable of eliminating various problems described above.

Another object of this invention is to provide a novel method of fabricating a MOS dynamic memory cell capable of eliminating various problems described above.

According to one aspect of this invention there is provided a MOS dynamic memory cell comprising a semiconductor substrate of a first conductivity type and having a first semiconductor region of a low impurity concentration; a first electroconductive layer formed on a first insulating film provided on a surface of the first semiconductor region; a second semiconductor region of the first conductivity type provided adjacent to one end of the first semiconductor region and having a higher impurity concentration than the first semiconductor region; a second electroconductive layer formed on a second insulating film provided on a surface of the second semiconductor region; a third semiconductor region of a second conductivity type formed adjacent to the second semiconductor region and having a second conductivity; means for applying different potentials to the third semiconductor region and to the first and second electroconductive layers whereby an inversion layer being formed on the surface of the first semiconductor region.

According to another aspect of this invention there is provided a method of fabricating a MOS dynamic memory cell comprising the steps of forming a first insulating film at least on a first semiconductor region of a semiconductor substrate having a first conductivity type, the first semiconductor region having a low impurity concentration;

forming a first electroconductive film on the first insulating film and then patterning the first electroconductive film;

selectively etching off a portion of the first insulating film by using the patterned first electroconductive film as a mask;

doping an impurity of the first conductivity type into the surface of the substrate through the selectively etched off portion so as to form a second semiconductor region having a higher impurity concentration than the substrate;

forming a second insulating film on the second semiconductor region and a third insulating film on the first electroconductive film;

forming a second electroconductive film on the second and third insulating films and then patterning the second electroconductive film;

selectively etching off a portion of the second insulating film by using the patterned second electroconductive film as a mask; and doping as impurity of a second conductivity type into the second semiconductor region through etched off portion of the second insulating film so as to form a third semiconductor region of the second conductivity type.

DESCRIPTION OF THE PREFERRED EMBODIMENTS

Figure 1:
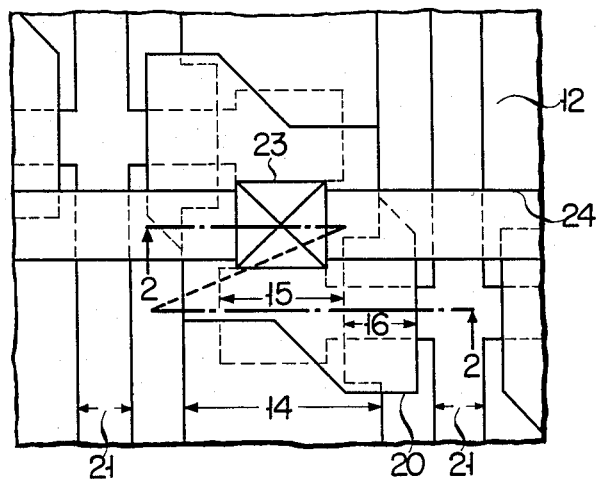
FIG. 1 is a plan view showing a portion of an MOS dynamic memory device constituted by memory cells embodying the invention.
Figure 2:
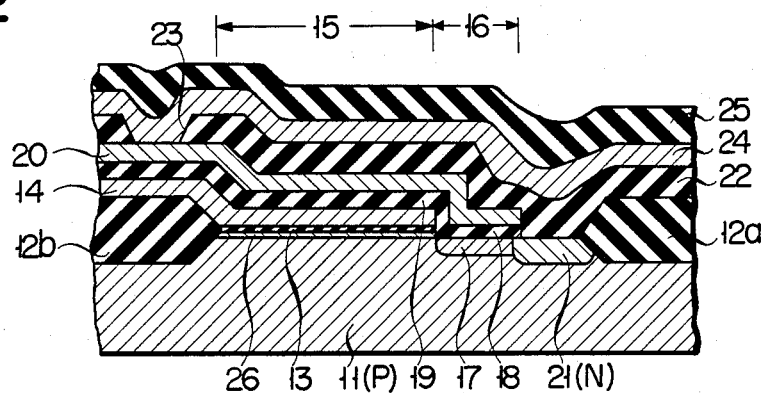
FIG. 2 is a sectional view taken along a line 2—2 shown in FIG. 1.

As shown in FIGS. 1 and 2, a preferred embodiment of the MOS dynamic memory cell of this invention comprises a P type silicon substrate 11 containing boron at a low concentration, for example at a concentration of less than $5 \times 10^{14}$ cm$^{-3}$, and provided with silicon films 12a and 12b which are used to separate or isolate adjacent memory cells (in the drawings, only one memory cell is shown). The memory cell is shown to comprise a MOS capacitor region 15 located adjacent the separating layer 12b and a MOS transistor region 16 located adjacent the MOS capacitor region 15. On the surface of the first semiconductor region of the substrate 11 on which is formed the MOS capacitor region 15 is provided a SiO$_2$ film 13 (first insulating film) for the MOS capacitor. A first polycrystalline silicon film 14 (a first conductive layer) is provided on the insulating film 13 to act as an electrode of the MOS capacitor. The SiO$_2$ film 13 has a thickness of less than 500 Å which is smaller than those of the separating layers 12a and 12b. A P type second region 17 having a higher impurity concentration than the substrate 11 is provided on the surface thereof adjacent the first semiconductor region, the second region 17 having a boron concentration of above $2 \times 10^{15}$ cm$^{-2}$. A third semiconductor region 21 is provided on the substrate surface between the second semiconductor region 17 and the separating layer 12a. The third region 21 has an N type conductivity formed by diffusing an N conductivity impurity, such as arsenic and phosphor for example, and a portion of the third region 21 extends to the drain of the MOS transistor region 16. The third semiconductor region 21 extends in a direction perpendicular to the surface of the sheet of the drawing and is used as a column line and a digit line of the MOS memory cell. The second region 17 is provided with a second SiO$_2$ film 18 which partially extends to the third semiconductor region 21, and a second polycrystalline silicon layer 20 (second conductive film) is formed on the second SiO$_2$ film 18 and extended to overlie above the SiO$_2$ film 19 formed on the first conductive film 14. Thus, the memory cell has a two layer structure comprising the first and second conductive films 14 and 20. Further, a SiO$_2$ film 22 is formed to cover the second conductive layer 20, the third semiconductor region 21 and the separating insulating layer 12a. A contact hole 23 is formed through the SiO$_2$ film 22 at a portion above a portion of the second conductive layer 20. An aluminum layer 24 is formed on the insulating layer 22 and a protective insulating layer 25 is formed on the aluminum layer 24. The surface of the first semiconductor region 13 of the substrate is formed as an inversion layer 26. Where the first and second electroconductive layers 14 and 20 are made of molybdenum or molybdenum silicide, it is possible to decrease the voltage loss of signals so that the aluminum layer 24 may be omitted.

FIG. 1 shows a portion of a MOS dynamic memory device fabricated with the memory cells shown in FIG. 2. As shown, the first conductive layers 14 (polycrystalline silicon layer) of the memory cells disposed in the direction of column are extended in the same column direction. The third semiconductor region 21 also extends in the column direction and is used as a digit line as well as a column line. The second conductive layer 20 is provided for a pair of memory cells arranged in the column direction, whereas the aluminum layer 24 extending in the row direction is contacting with the second conductive film 20 through the contact hole 23 and used as a row line. Other component elements are designated by the same reference characters as those in FIG. 2 so that their description is omitted.

Figure 3:
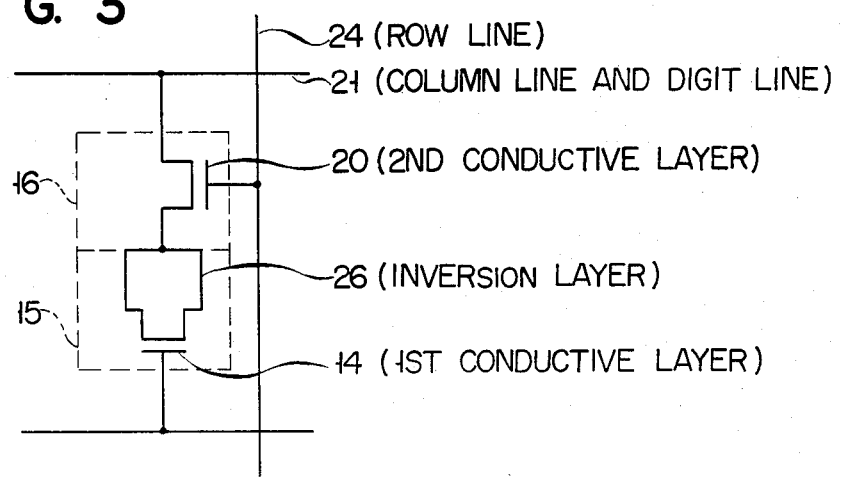
FIG. 3 shows an equivalent circuit of a memory cell of this invention.

FIG. 3 is a connection diagram showing electrical connection of the MOS transistor region 16 and a MOS capacitor region 15 of a memory cell and the electrical connection between these regions and the row line and column line (or a digit line). The first conductive layer or capacitor electrode 14, the second conductive layer 20 (the gate electrode of the MOS transistor), and the third semiconductor region 21 shown in FIG. 3 are supplied with different potentials.

Figure 7:
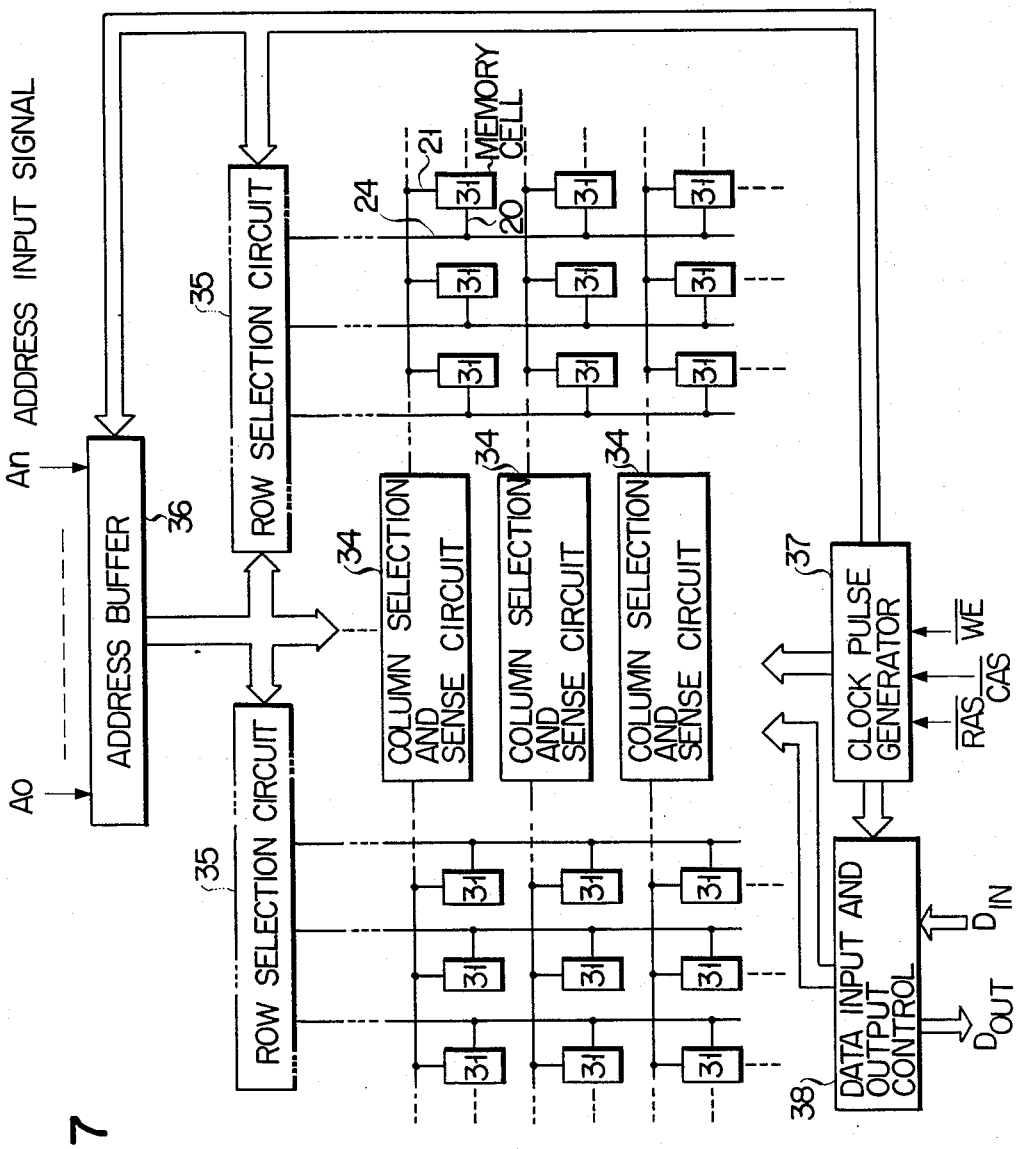
FIG. 7 is a diagrammatic block diagram showing a MOS dynamic memory device fabricated with the memory cells of this invention.

In the block diagram of FIG. 7 showing a MOS dynamic memory device utilizing a plurality of memory cells of this invention, the column or digit lines 21 (third semiconductor region) of memory cells 31 arranged in the column direction are connected to circuits 34 respectively containing column selection circuits and sense circuits. The row lines 24 (aluminum conductive layer) of the memory cells 31 arranged in the row direction are connected to the row selection circuits 35 respectively. The row selection circuits 35 are respectively connected to an address differ circuit 36 supplied with address input signals $A_o$ through $A_n$. A data input and output control circuit 38 is connected to a plurality of column selection and sense circuits 34 and applied with an input data $D_{in}$ for producing an output data $D_{out}$, a clock pulse generator 37 supplied with clock pulses $\overline{RAS}$, $\overline{CAS}$ and $\overline{WE}$ is provided to apply its output to column selection and sense circuits 34, data input and output circuit 38, row selection circuits 35 and address buffer circuit 36. Each row selection circuit 35 is provided with a bootstrap means for applying a potential to the gate electrode of a MOS transistor of a memory cell 31 for causing the MOS transistor to operate in a triode region. Whiel a balanced type sense circuits are used in the block diagram shown in FIG. 7 it should be understood that it is also possible to use a single end type sense circuit or any other well known sense circuits.

Figure 4A:
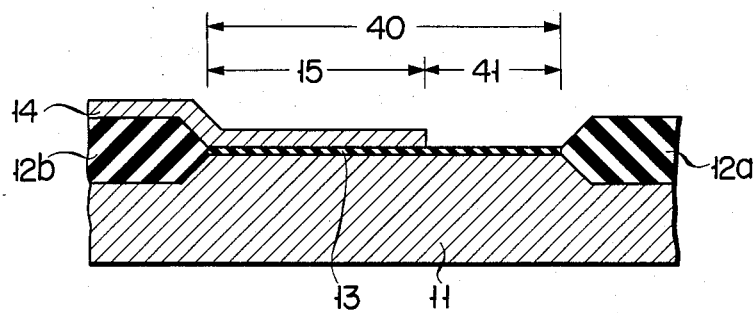
FIGS. 4A through 4C are sectional views showing one example of the steps of the method of fabricating a memory cell of this invention.

One example of the method of manufacturing the memory cell of this invention will be described hereunder with reference to FIGS. 4A through 4C. At fist, as shown in FIG. 4A, a P type silicon substrate 11 containing boron at a concentration of less than $5 \times 10^{14}$ cm$^{-3}$ is prepared, the substrate having a resistivity of an order of 50 ohm-cm, for example, SiO$_2$ films 12a and 12b are formed on both ends of a region 41 constituting a memory cell so as to isolate adjacent cells, a SiO$_2$ film 13 having a thickness of less than 500 Å is formed on the surface of the substrate 11 corresponding to the region 40 and a first conductive layer (polycrystalline silicon layer) is formed on the SiO$_2$ film 13. This polycrystalline silicon layer is etched to retain only the first conductive layer 14 corresponding to the region 15 which forms a MOS capacitor.

Figure 4B:
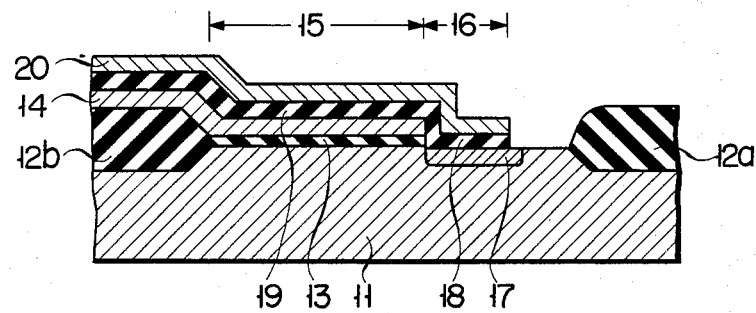

The, as shown in FIG. 4B, portions of the SiO$_2$ film 13 in the region 41 of the region 40 are etched off except the region 15. Then, ions of boron are implanted into the substrate surface in region 16 on which a MOS transistor is to be formed so as to form a second semiconductor region 17 containing boron at a high concentration. A SiO$_2$ film 18 (second insulating film) is grown on the second semiconductor region 17 and at the same time the first conductive layer 14 is oxidized to form a SiO$_2$ film 19. Then a second conductive film (polycrystalline silicon layer) 20 is formed on the SiO$_2$ films 18 and 19. The second conductive film is patterned to form the MOS transistor in the region 16. In this example, the boron concentration of the second semiconductor region 17 is about $2 \times 10^{15}$ cm$^{-3}$.

Figure 4C:
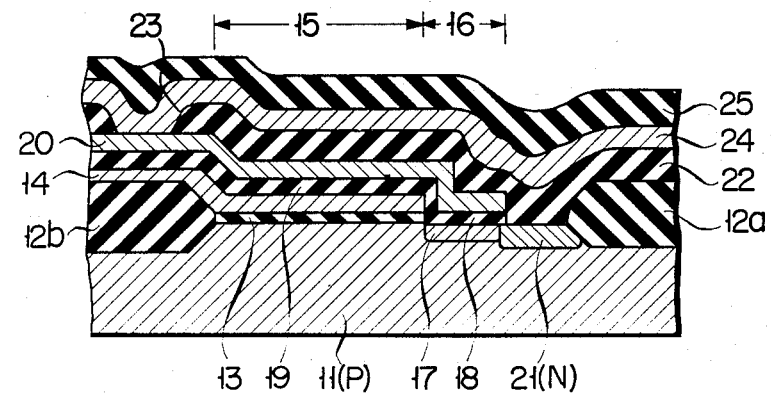

Then, as shown in FIG. 4C, on the surface of the substrate 11 between the MOS transistor region 16 and the separating insulating layer 12a is formed a third semiconductor region 21 in which ions of N type impurity such as arsenic or phosphor are diffused. This region 21 extends to a point near the drain of the MOS transistor. After completion of the steps described above, a SiO$_2$ film 22 is formed which is provided with a contact hole 23 at a predetermined portion thereof. Then an aluminium film 24 is formed on the SiO$_2$ film 24 to cause the aluminium film 24 to contact with the second conductive layer 20. Thereafter a protective insulating film 25 is formed to finish the fabricating steps.

The second semiconductor region 17 may be formed by implanting ions of boron by using only the first conductive film 14 as a mask, because the conductivity type of an unwanted portion of the region 17 is compensated for when the third semiconductor region 21 is formed.

Figure 6:
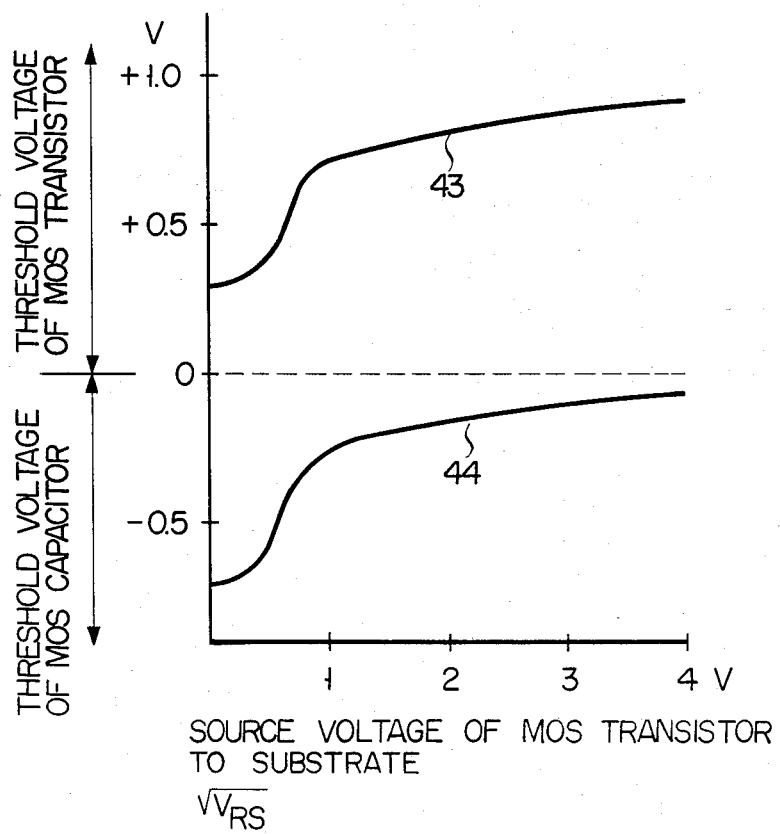
FIG. 6 shows characteristic curves which show variations in the threshold voltages of a MOS transistor section and a MOS capacitor section with respect to the souce voltage of the MOS transistor as viewed from the semiconductor substrate of the memory cell of this invention.

The operation of the memory cell of this invention will now be described. It is essential that the inversion layer 26 (FIG. 2) should not be readily diminished regardless of the rise in the potential written into the MOS capacitor. The characteristics of the memory cell constructed as above described are shown by curves 43 and 44 in FIG. 6, in which the abscissa represents the source voltage of the MOS transistor as viewed from the substrate, whereas the ordinate the threshold voltages $V_{Th}$ of the MOS transistor and the MOS capacitor respectively. As shown by curves 43 and 44, the threshold voltage $V_{th}$ of the MOS capacitor is less than 0 volt (curve 44). This is caused by the fact that ionized impurity of certain substance and a vacancy always present in the insulating film 13 of the MOS capacitor and that a surface level presents at the interface between the substrate 11 and the insulating film 13 with the result that electric field is created in the interior of the substrate corresponding to region 15 to attract electrons to the surface thereof. Accordingly the inversion layer 26 shown in FIG. 2 is formed. The electric field expressed in terms of a gate potential is called a flat band potential $V_{FB}$ (see equation (1)) which usually assumes a negative value. The Fermi level $\varphi_{FP}$ shown in equation () will become lower as the impurity concentration of the substrate 11 decreases. For example, where a substrate having a resistivity of 50 ohm-cm is used the Fermi level is at about 0.2V. On the other hand, the flat band potential $V_{FP}$ amounts to $-1$ V through $-1.5$ V. $Q_B$ is obtained by substituting $N_A = 2.5 \times 10^{20}$ (m$^{-3}$) and $V_{RS} = 2$ (which means that $-2$ V is applied to the substrater 11) into a equation (2). Assuming that the first insulating film 13 has a thickness of $T_{OX} = 400$ Å, the third term $-(Q_B/C_O)$ in equation (1) can be calculated as follows.

$$-(Q_B/C_O) = 0.16 \text{ V}.$$

From this, it can be noted that the inversion voltage or the threshold voltage $V_{Th}$ of the MOS capacitor lies in a range of from $-0.44$ to $-0.94$ V. Where a data in the form of a potential of 5 V is written into the MOS capacitor of the memory cell the source voltage of the MOS memory device as viewed from the substrate is raised to 7 V, in other words even when the MOS capacitor is written with 5 V and $-2$ V is impressed upon the substrate, since the impurity concentration $N_A$ (see equation 2) of the substrate 11 is low, the effect of the voltage $V_{RS}$ (the source potential as viewed from the substrate) upon the term $-(Q_B/Q_C)$ is relatively small so that $-(Q_B/C_O) = 0.29$ V. Consequently, the threshold voltage $V_{th}$ of the MOS capacitor lies in a range of from $-0.3$ V to $-0.8$ V.

As above described, since the memory cell of this invention utilizes a substrate 11 having a low impurity concentration, the surface of the substrate region that constitutes the MOS capacitor is always in the inverted state. In other words, the inversion layer 26 shown in FIG. 2 always presents. This means that the defect of the prior art memory cell has been completely eliminated in which the inversion layer 26 diminishes with the increase in the potential written into the MOS capacitor thus making it impossible to write into the MOS capacitor.

The second advantage of this invention lies in that the depletion mode region of the MOS transistor is entirely included in the MOS capacitor region 15 and that the depletion mode region is not extended to any other regions. According to the prior art method, it was necessary to implant ions of an impurity by using an IC mask for the purpose of forming a MOS capacitor of the depletion mode. The use of such IC mask accompanies an alignment error so that it has been impossible to form a MOS transistor region at a position extremely close to the region inplanted with ions. For this reason, the memory cell of this invention, where the first conductive layer 14 and the second conductive layer 20 are constructed to have a double layer structure so as to extremely closely arranging the MOS capacitor region 15 and the MOS transistor region 16 and to construct only the MOS capacitor to have the depletion mode can never been realized by the prior art technique. According to this invention, a low impurity concentration substrate is used as the substrate 11 and only the MOS capacitor is constructed to have a depletion mode by utilizing the dislocation and vacancy of the substrate and by using self alignment method without using an IC mask.

Further, as it is possible to minimize the back bias effect of the threshold voltage $V_{Th}$ of the MOS transistor of the memory cell it is possible to decrease the gate voltage to be impressed upon the gate electrode of the MOS transistor at the time of accessing the memory device. As has been pointed out hereinabove, it is necessary to maintain the MOS transistor in its conductive state even when the threshold voltage $V_{Th}$ of the MOS transistor is raised by the back bias effect. For this reason, a voltage higher than the power supply voltage by a voltage corresponding to the threshold voltage $V_{Th}$ must the impressed upon the gate electrode of the MOS transistor. As shown by curve 43 in FIG. 6, the threshold voltage of the MOS transistor is equal to about 0.9 V. Where the power supply voltage has a value of 5 V, a voltage of from 6.5 V to 7.0 V is required as the gate voltage of the MOS transistor by taking into consideration a sufficiently large margin. As a means for producing such voltage, is known a voltage step up device utilizing a bootstrap using a capacitor coupling. As above described, since it is possible to make relatively small the gate voltage of the MOS transistor, in the memory cell of this invention, the MOS capacitor can be made small thereby decreasing the chip area.

Regarding only the MOS transistor, at the step of forming the second semiconductor region 17, the portion extending toward the third semiconductor region 21 can be perfectly compensated for by arsenic or boron diffused by using the second conductive film (gate electrode) as a mask, that is, by using a self alignment method.

Another advantage of this invention lies in that the stray capacitor $C_P$ can be made small. Decrease in the total capacitance, that is, the stray capacitance presenting at the signal input terminal of the sense circuit 34 increases the level of signal $V_S$ received by the sense circuit, which constitutes an important factor as above described. In the memory cell of this invention, since the third semiconductor region 21, that is, the digit line 12 is formed on the surface of the substrate having a high resistivity by a P-N junction, the capacitance of this junction, that is, the stray capacitance can be made small.

Summarizing the above description, the memory cell of this invention has the following advantages.

1. In the prior art memory cell, a voltage of about 75% of the power supply voltage could be written into the memory cell, whereas the memory cell of this invention can be written with voltage nearly equal to the power supply voltage, thereby increasing by about 33% the charge stored in the MOS capacitor. Accordingly, the operation range of the sense circuit can be broadened.

2. Assuming the dynamic range of a sense amplifier circuit according to this invention is equal to that of the prior art, the area of the memory cell can be reduced. Moreover, as it is possible to increase the thickness of the insulating film of the MOS capacitor by an amount corresponding to the increase in the amount of the charge stored in the memory cell, the reliability and the manufacturing yield of the memory cells can be improved.

3. The first to third semiconductor regions can be formed with self aligning technique. This enables making respective regions at high accuracies.

4. Since a high resistivity semiconductor substrate 11 is used, the junction capacitance, that is, the stray capacitance of the third semiconductor region 21 can be reduced thereby increasing the level of the signal $V_S$ received by the sense circuit.

5. The use of the high resistivity semiconductor substrate 11 reduces the back bias effect upon the threshold voltage of the MOS transistor and the MOS capacitor, whereby variation in the access time caused by the variation in the back bias can be prevented.

6. As the amount of charge stored in the memory cell is increased, it is possible to prevent so-called "soft error" which is caused by $\alpha$ particles impinging upon the semiconductor substrate to form a large quantity of high energy electrons which are diffused in the semiconductor substrate and trapped by the capacitor of the memory cell.

Figure 5A:
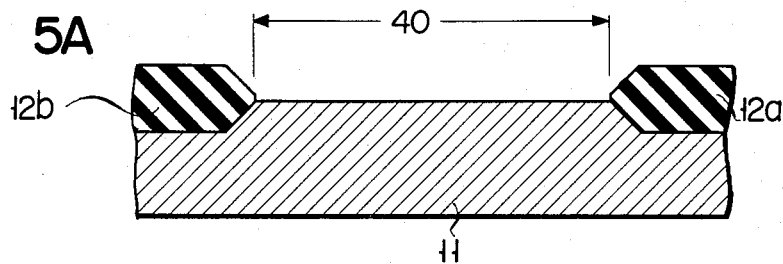
FIGS. 5A and 5B are sectional views showing the steps of a modified method of fabricating a memory cell of this invention.
Figure 5B:
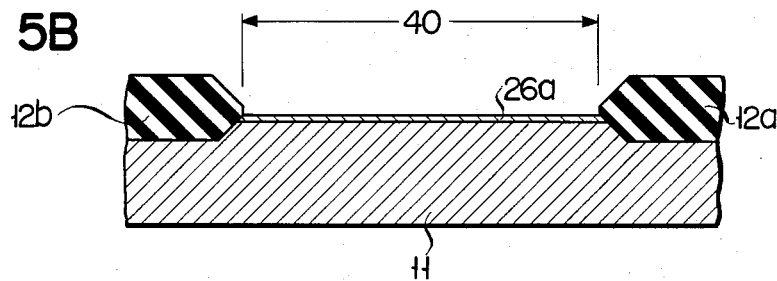

The memory cell of this invention can also be prepared by a method shown in FIGS. 5A and 5B. More particularly, in a step shown in FIG. 5A, insulating layers 12a and 12b adapted to separate adjacent cells are provided on the low concentration substrate 11 of the first conductivity type (this corresponds to a portion of the step shown in FIG. 4A). Then a layer 26a of the second conductivity type is formed in the region 40 of the substrate surface by implanting ions of N conductivity substance, for example arsenic or phosphor. The inpurity concentration of the layer 26a is about $1 \times 10^{10}$ $cm^{-3}$ for example. The steps succeeding the step shown in FIG. 5B are identical to those shown in FIGS. 4A through 4C. This modified method can decrease the threshold voltage of the MOS capacitor below that of the embodiment shown in FIG. 4C. Furthermore, when the impurity concentration of the second semiconductor region is controlled suitably, it is possible to make the threshold voltage $V_{Th}$ of the MOS transistor to be substantially equal to that of the embodiment shown in FIG. 4C.

What is claimed is:

1. A MOS (Metal Oxide Semiconductor) dynamic memory cell comprising:

a semiconductor substrate of a first conductivity type having a first semiconductor region of a low impurity concentration;

a first electroconductive layer formed on a first insulating film provided on the surface of said first semiconductor region;

a second semiconductor region of the first conductivity type formed in said semiconductor substrate by implanting ions by using said first electroconductive layer as a mask and having one end contacting one end of the surface region of said first semiconductor region, said second semiconductor region having a higher impurity concentration than that of said first semiconductor region;

a second electroconductive layer formed on a second insulating layer provided on the surface of said second semiconductor region and extended along a third insulating layer provided on said first electroconductive layer;

a third semiconductor region formed in said semiconductor substrate and having one end in contact with the other end of said second semiconductor region, said third semiconductor region having a second conductivity type and being in contact also with a portion of the substrate, said portion hving the same impurity concentration as said first semiconductor region;

means for applying different potentials to said third semiconductor region and to said first and second electroconductive layers;

an inversion layer being formed in said surface region of said first semiconductor region by two means in which one means includes means for applying a voltage between said first electroconductive layer and said semiconductor substrate and the other means includes the impurity concentration of said first semiconductor region being at less than $5 \times 10^{14}$ cm$^{-3}$;

one end of said inversion layer adjacent to said second semiconductor region and one end of said first electroconductive layer adjacent to said second semiconductor region being aligned with each other;

said one end of said inversion layer and the corresponding end of said second semiconductor region being closely contacted with each other; and said inversion layer being used as a depletion mode MOS capacitor.

2. The MOS dynamic memory cell according to claim 1 wherein said first insulating layer has a thickness of less than 500 Å.

3. The MOS dynamic memory cell according to claim 1 wherein a MOS transistor is constituted by said second electroconductive layer, said second insulating layer, said second semiconductor region, and has a threshold voltage higher than 0.5 volt.

4. The MOS dynamic memory cell according to claim 1 wherein said second electroconductive layer is applied with a potential higher than that applied to said first electroconductive layer.

5. The MOS dynamic memory cell according to claim 1 wherein each of said first and second electroconductive layers is made of molybdenum or molybdenum silicide.

6. The MOS dynamic memory cell according to claim 1 which further comprises a third insulating layer formed on said first electroconductive layer and wherein a portion of said second electroconductive layer overlies said third insulating layer.

7. The MOS dynamic memory cell according to claim 1 wherein said first to third insulating films comprise silicon oxide films (SiO$_2$) formed in oxidizing atmosphere and said first and second electroconductive layers comprise polycrystalline silicons.

8. The MOS dynamic memory cell according to claim 1 further comprising:

said second electroconductive layer, said second insulating layer and said second semiconductive region constituting an N channel MOS transistor;

first means for applying a first level positive voltage to said first electroconductive layer;

means for applying a second level positive voltage higher than said first level to said second electroconductive layer when said MOS dynamic memory cell is accessed; and second means for applying a voltage having a level lower than the threshold voltage of said N channel MOS transistor to said second electroconductive layer when said MOS dynamic memory cell holds its data, whereupon said first level positive voltage is applied to said first electroconductive layer by said first means.

9. The MOS dynamic memory cell according to claim 8 wherein said first level positive voltage has the same level as that of a driving source which drives a memory system including a plurality of said MOS dynamic memory cells.

10. The MOS dynamic memory cell according to claim 8 wherein when said MOS dynamic memory cell is accessed said second level positive voltage is higher than said first level by at least the threshold voltage of said N channel MOS transistor.

* * * * *